United States Patent [19]

Sheu

[11] Patent Number: 5,872,036
[45] Date of Patent: Feb. 16, 1999

[54] METHOD OF MANUFACTURING A SPLIT-GATE FLASH MEMORY CELL

[75] Inventor: Yau-Kae Sheu, Hsinchu, Taiwan

[73] Assignee: United Semiconductor Corp., Hsin-Chu, Taiwan

[21] Appl. No.: 998,331

[22] Filed: Dec. 24, 1997

[30] Foreign Application Priority Data

Oct. 13, 1997 [TW] Taiwan ................................. 86114925

[51] Int. Cl.$^6$ ............................................. H01L 21/8247
[52] U.S. Cl. ............................................. 438/266; 438/593
[58] Field of Search ........................... 438/266, 257–265, 438/593, 594, 770

[56] References Cited

U.S. PATENT DOCUMENTS

| 5,242,848 | 9/1993 | Yeh . |
| 5,371,028 | 12/1994 | Koh . |
| 5,385,856 | 1/1995 | Hong . |
| 5,453,391 | 9/1995 | Yiu et al. . |
| 5,482,879 | 1/1996 | Hong . |
| 5,686,333 | 11/1997 | Sato . |
| 5,705,416 | 1/1998 | Kim et al. . |
| 5,716,865 | 2/1998 | Ahn . |

Primary Examiner—Richard A. Booth
Attorney, Agent, or Firm—Cislo & Thomas LLP

[57] ABSTRACT

A split-gate flash memory cell structure comprising a semiconductor substrate having a gate oxide layer already formed thereon. A first gate is then formed over the gate oxide layer, and a cross-section of the first gate contains two corners, one of which is a sharp corner. An insulating dielectric layer is then formed over the first gate. The insulating dielectric has a lens-shaped cross-section located above the sharp corner. Next, a second gate is formed over the insulating dielectric layer, and surrounded the first gate. A first doped region is formed in the substrate below the sharp corner. Then, a second doped region is formed in the substrate located on the other side of the first gate just opposite the first doped region, furthermore, the second doped region is separated from the first gate by a distance. There is a channel region between the first doped region and the second doped region, and the sharp corner of this invention is located above the semiconductor substrate outside the channel region.

4 Claims, 4 Drawing Sheets

METHOD OF MANUFACTURING A SPLIT-GATE FLASH MEMORY CELL

BACKGROUND OF THE INVENTION

1. Field of Invention

The present invention relates to a method of manufacturing a flash memory More particularly, the present invention relates to a method of manufacturing a split-gate flash memory cell that has a sharp corner between the floating gate and the control gate, and the sharp corner is formed outside the channel region.

2. Description of Related Art

A conventional flash memory is a type of electrical erasable programmable read-only memory (EEPROM), which in turn is a type of non-volatile memory. In general, an EEPROM cell comprises two gates. One of the gates known as a floating gate is fabricated from polysilicon and is used for charge storage. The second gate known as the control gate is used for the controlling the input and output of data. The above floating gate is located beneath the control gate, and is generally in a floating state because there is no connection with external circuits. The control gate is normally wired to the word line. One of the characteristics of flash memory is its capacity for block-by-block memory erase. Furthermore, the speed of memory erase is fast, and normally takes just 1 to 2 seconds for the complete removal of a whole block of memory. For most other EEPROM, memory erase can take up to several minutes due to its bit-by-bit operation. Articles concerning flash memory are numerous, and one of them, which produces an improved flash memory structure, is described in U.S. Pat. No. 5,045,488, for example.

FIG. 1 is a cross-sectional view showing the flash memory cell structure according to the U.S. Pat. No. 5,045,488. As shown in FIG. 1, a first gate 11 and a second gate 12 is formed above a semiconductor substrate 10. The first and second gates, for example, are polysilicon layers. In between the first gate 11 and the second gate 12, there is an insulating layer 13. The first gate 11, the insulating layer 13 and the second gate 12 together constitute a stacked-gate structure 14. On each sides of the stacked-gate structure 14, there is an ion-doped region in the substrate 10, namely, a source region 15 and a drain region 16. The characteristic of this type of flash memory cell structure is the split-gate design for the stacked-gate 14. In other words, the first gate 11 and the second gate 12 are distributed horizontally along the top of the substrate 10. Only a certain central portions of the first gate 11 and the second gate 12 overlaps such that one is stacked on top of the other in a vertical direction. Furthermore, the first gate 11 has sharp corners 17 for providing a high electric field, which confers a fast erase capability to the flash memory.

However, the aforementioned sharp corners 17 are located within the channel region. When the flash memory cells are repeated used, after many cycles, electrons will be trapped in the oxide dielectric layer around the corner areas. The amount of trapped electrons there will depend on the number of repeated charge/discharge cycles. Since these trapped electrons are located between the first gate and the second gate, electrical conductivity of the device will be affected. For example, one of the effects is to increase the threshold voltage of the device, leading to a lowering of the channel current. Such drift in the electrical properties is damaging to the operation of the device.

In light of the foregoing, there is a need in the art to improve the flash memory cell structure.

SUMMARY OF THE INVENTION

Accordingly, the present invention is directed to provide a split-gate flash memory cell structure whose gate has a sharp corner that is formed away from the channel region. Hence, problems caused by sharp corner near the channel region are avoided, thereby preventing the electrical drift in a conventional method of production.

To achieve these and other advantages and in accordance with the purpose of the invention, as embodied and broadly described herein, the invention provides a method for manufacturing a split-gate flash memory cell structure. The method comprises the steps of providing a semiconductor substrate, then forming a gate oxide layer over the substrate. Next, a first conductive layer is formed over the gate oxide layer, then patterning the first conductive layer to form a first gate. A first dielectric layer is then formed over the first gate. Subsequently, a photoresist layer is formed over a portion of the first dielectric layer above the first gate. Next, using the photoresist layer as a mask, the dielectric layer is etched to form a spacer on the sidewall of the exposed first gate. Using the spacer as a mask, a first ion doping operation is then carried out to form a first doped region in the exposed region of the substrate on one side of the first gate. After that, the photoresist layer is removed followed by a thermal oxidation operation to form an oxide layer having a lens-shaped cross-section on the first gate where there is no dielectric layer above. Because of the heating process above, doped ions will diffuse and expanding the first doped region a little. Next, the first dielectric layer is removed followed by a second ion doping operation to form a second doped region on the other side of the first gate just opposite the first doped region, and the second doped region is at a distance from the first gate. Subsequently, another thermal oxidation is carried out to form a second dielectric layer over the substrate, the first gate and the lens-shaped oxide layer. Finally, a second conductive layer is formed over the second dielectric layer followed by patterning the second conductive layer to form a second gate, thereby completing the fabrication of the split-gate flash memory cell structure.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
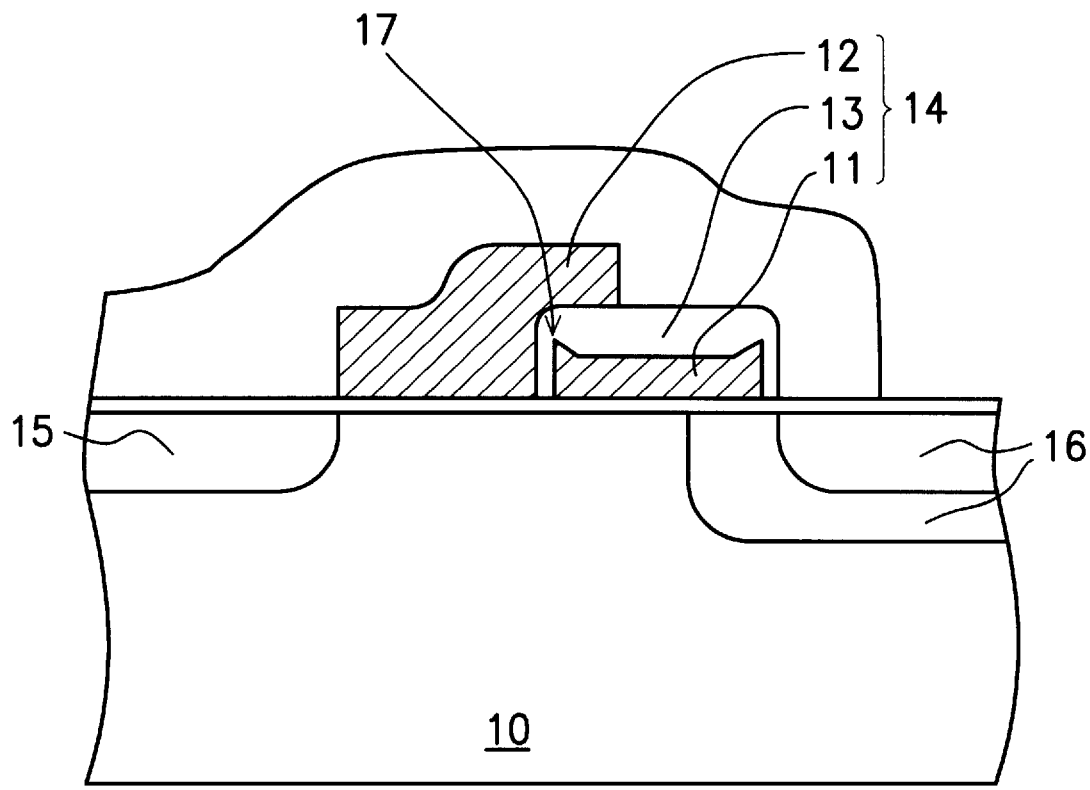
FIG. 1 is a cross-sectional view showing a conventional flash memory cell structure.

Reference will now be made in detail to the present preferred embodiments of the invention, examples of which are illustrated in the accompanying drawings. Wherever possible, the same reference numbers are used in the drawings and the description to refer to the same or like parts.

The present invention provides an improved split-gate flash memory cell structure. The memory cell has a sharp corner between the floating gate and the control gate for speeding up memory erase operation. A sharp corner is able to increase memory erase because when a biased voltage is applied to the control gate, the sharp corner will produce a high electric field. A high electric field causes the electrons to speed across the gap readily from the floating gate to the control gate. Moreover, the sharp corner of this invention is formed in a region above the semiconductor substrate away from the channel. Since the sharp corner is not located above the channel region, the drifting of electrical properties in a device, for example, a threshold voltage change, due to the trapping of electric charges can be avoid.

Figure 2A:
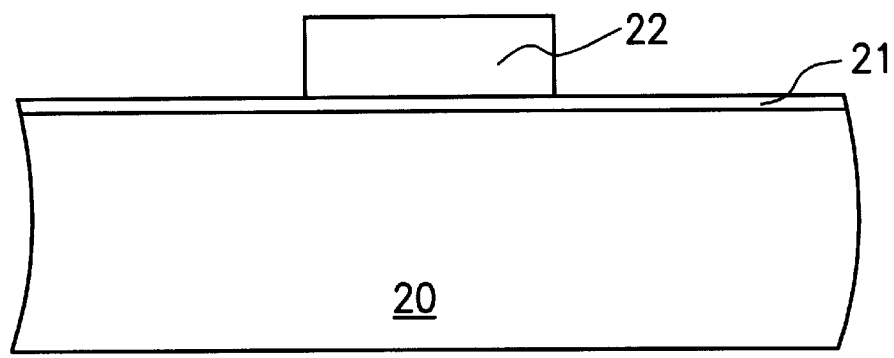
FIGS. 2A through 2G are cross-sectional views showing the progression of manufacturing steps in the production of a split-gate flash memory cell structure according to one preferred embodiment of this invention.

FIGS. 2A through 2G are cross-sectional views showing the progression of manufacturing steps in the production of a split-gate flash memory cell structure according to one preferred embodiment of this invention. First, as shown in FIG. 2A, a semiconductor substrate 20 is provided. A gate oxide layer 21 having a thickness of between 100 Å to 250 Å is then formed over the substrate 20. Next, a first conductive layer is formed over the gate oxide layer 21. The first conductive layer is then patterned to form a first gate 22. The first gate 22 functions as a floating gate. The first gate 22 is preferably a polysilicon layer having a thickness of between 1000 Å to 2000 Å.

Figure 2B:
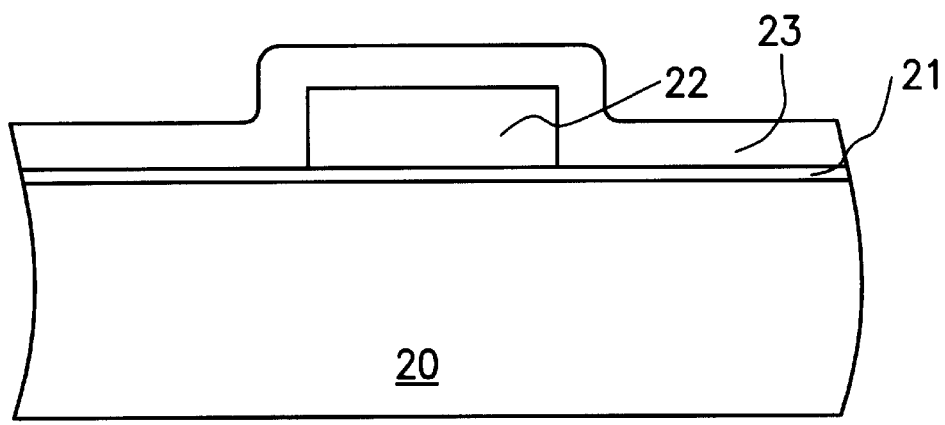

Next, as shown in FIG. 2B, a first insulating dielectric layer 23 is formed over the first gate 22. The first insulating dielectric layer 23 can be a silicon nitride layer ($Si_3N_4$) and having a thickness preferably between 1000 Å to 2000 Å.

Figure 2C:
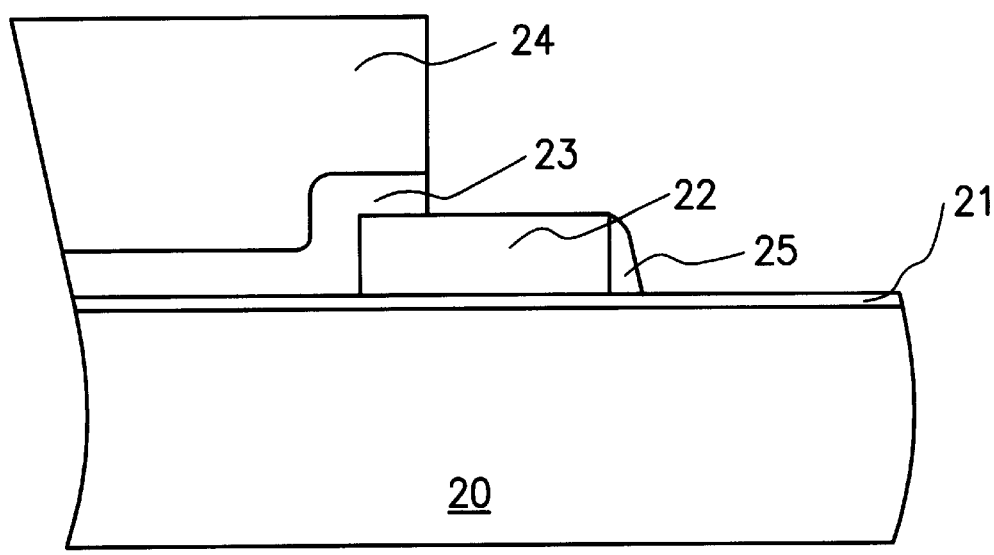

Next, as shown in FIG. 2C, a photoresist layer 24 is formed over a portion of the first insulating dielectric layer 23 above the first gate 22. In a subsequent step, using the photoresist layer 24 as a mask, portions of the first insulating dielectric layer 23 is etched to form a spacer 25 on the sidewall of the exposed first gate 22. Width of this spacer 25 should be between 0.1 $\mu$m to 0.2 $\mu$m. The spacer 25 is preferably a silicon nitride layer, the same material as the first insulating dielectric layer 23.

Figure 2D:
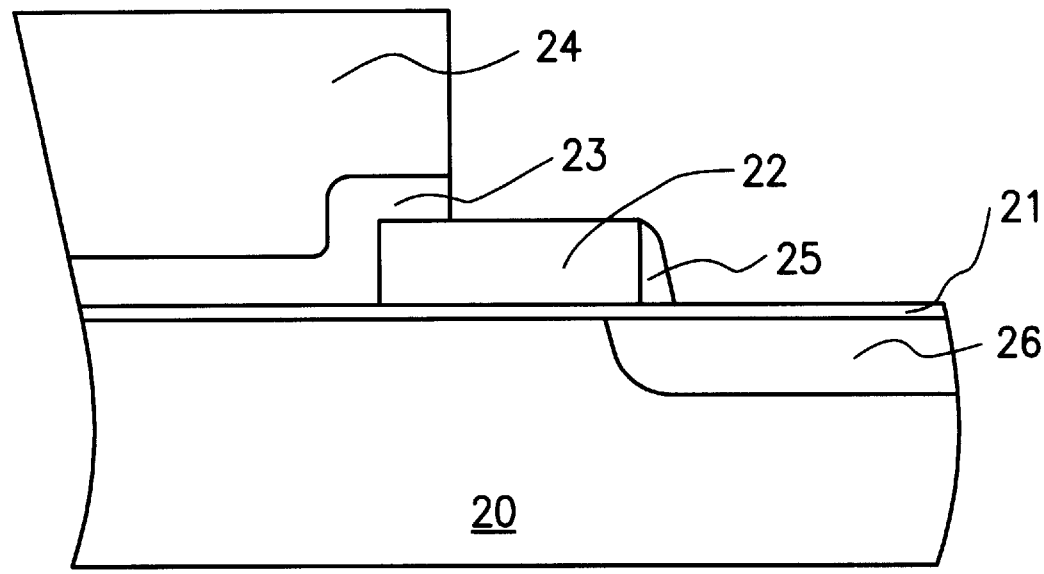

Next, as shown in FIG. 2D, using the spacer 25, the first gate 22 and the first insulating dielectric layer 23 as masks, an ion doping operation is performed. In the doping operation, phosphorus ions having an energy level of about 50 KeV to 80 KeV and a dosage level of about 1E15 to 5E15 are implanted into the semiconductor substrate 20 on one side of the exposed first gate 22, thereby forming a first doped region 26. After that, the photoresist layer 24 is removed.

Figure 2E:
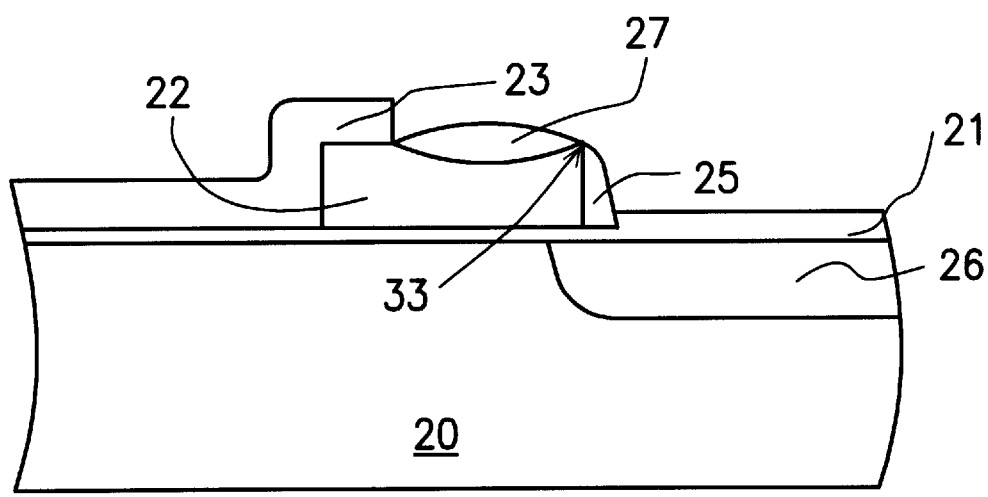

Next, as shown in FIG. 2E, a thermal oxidation is carried out to form an oxide layer 27 having a lens-shaped cross-section on the exposed first gate 22. The oxide layer 27 has a thick mid-section and thin peripheral region. The mid-section preferably has a thickness of about 1000 Å to 2000 Å, while the peripheral region has a thickness of about 200 Å to 400 Å. Both the spacer 25 and the first insulating dielectric layer 23 are silicon nitride layers. Since an oxide layer cannot be formed by oxidizing a silicon nitride layer, the oxide layer 27 is able to form over the first gate 22 only because it is a polysilicon layer. Consequently, a sharp corner 33 is formed in the first gate 22. In addition, the heat produced by the thermal oxidation process will cause ions to diffuse, and so the area of the first doped region 26 will expand a little. Furthermore, the gate oxide layer 21 will also grow thicker through the thermal oxidation operation as can be seen in FIG. 2E.

Figure 2F:
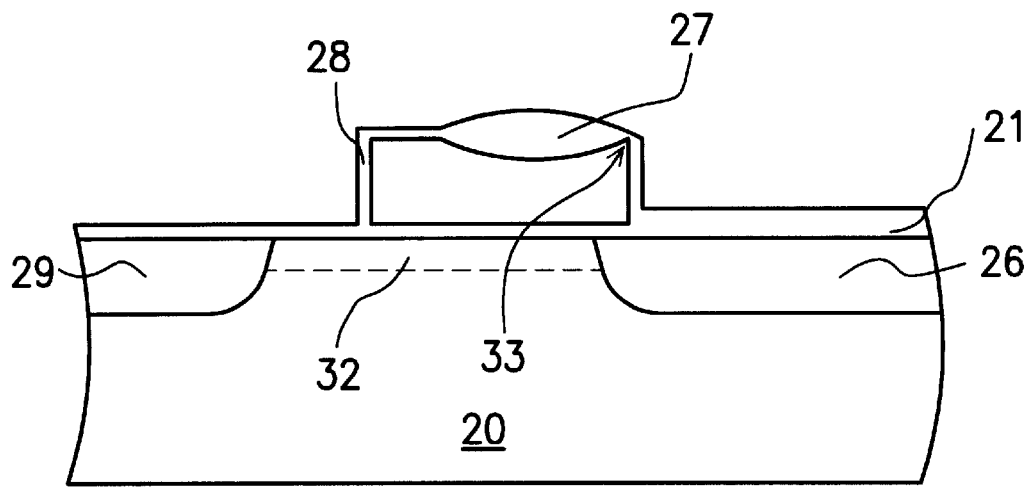

Next, as shown in FIG. 2F, the first insulating dielectric layer 23 is removed using phosphoric acid ($H_3PO_4$).

Thereafter, a second doped region 29 is formed by implanting arsenic ions into the semiconductor substrate 20 on the other side of the first gate 22 just opposite the first doped region 26. The implanted arsenic ions have an energy level of about 40 KeV to 100 KeV and a dosage level of about 1E15 to 5E15. The second doped region 29 is separated from the first gate by a distance instead of forming an adjacent structure. Between the first doped region 26 and the second doped region 29, there is a channel region 32 (shown by a dash line). Subsequently, a second thermal oxidation is carried out to form a second dielectric layer 28 having a thickness of between 150 Å to 300 Å over the semiconductor substrate 20, the first gate 22 and the lens-shaped oxide layer 27.

Figure 2G:
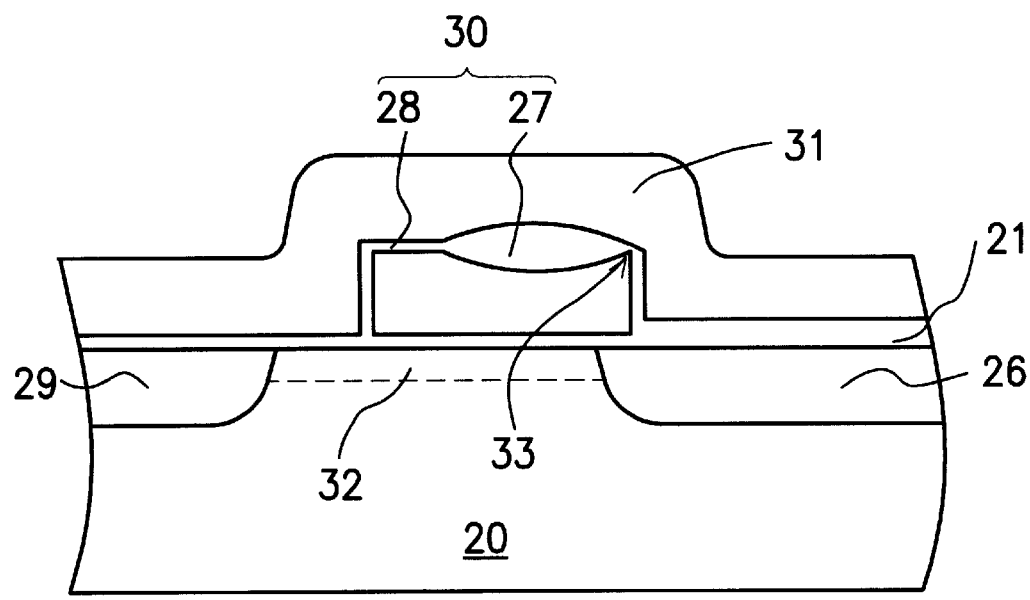

Next, as shown in FIG. 2G, the aforementioned lens-shaped oxide layer 27 and the second dielectric layer 28 constitutes the intermediate gate dielectric layer 30. A second conductive layer is formed over the gate layer 30, and then patterned to form a second gate 31 that has a thickness of between 1500 Å to 3000 Å. The second gate 31 is a polysilicon layer functioning as a control gate in the flash memory. Hence, the flash cell memory structure of this invention is finally complete. It should be noted that the sharp corner 33 is not directly located above the channel region 32.

As a summary, the split-gate flash memory cell structure of this invention has several advantages over a conventional structure, namely:

(1) The memory cell has a sharp corner 33 between the floating gate (first gate 22) and the control gate (second gate 31) for speeding up memory erase operation. A sharp corner is able to increase memory erase because when a biased voltage is applied to the control gate, the sharp corner will produce a very high electric field. A high electric field causes electrons to speed across the gap readily from the floating gate to the control gate.

(2) The sharp corner 33 of this invention is formed in a region above the semiconductor substrate away from the channel. Since the sharp corner is not located directly above the channel region 32, drifting of electric properties in the device, for example, a threshold voltage change, due to the trapping of electric charges can be avoid.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a split-gate flash memory cell structure, comprising the steps of:

providing a semiconductor substrate;

forming a gate oxide layer over the substrate;

forming a first conductive layer over the gate oxide layer, then patterning the first conductive layer to form a first gate;

forming a first dielectric layer over the first gate to expose a portion of said first gate;

forming a photoresist layer overlying a portion of the first dielectric layer above the first gate, and using the photoresist layer as a mask, etching the first dielectric layer to form a spacer on the sidewall of said exposed portion of the first gate;

using the spacer as a mask, performing a first ion doping operation to form a first doped region on one side of the first gate, and then removing the photoresist layer;

performing a first thermal oxidation operation to form a lens-shaped oxide layer on said exposed portion of the first gate so that a sharp corner is also formed in the first gate under the lens-shaped oxide layer above the first doped region;

removing the first dielectric layer;

performing a second ion doping operation to form a second doped region on the other side of the first gate opposite the first doped region, so that the second doped region is separated by a distance from the first gate;

performing another thermal oxidation to form a second dielectric layer over the substrate, the first gate and the lens-shaped oxide layer; and forming a second conductive layer over the second dielectric layer, and then patterning the second conductive layer to form a second gate.

2. The method of claim 1, wherein the step of performing the first thermal oxidation also expands the first doped region due to ion diffusion caused by heating.

3. The method of claim 1, wherein the step of forming the lens-shaped oxide layer includes forming an oxide having a thick mid-section and a thin peripheral section.

4. The method of claim 1, wherein the steps of forming the flash memory cell in structure further includes the step of forming a channel region, which is located between the first doped region and the second doped region, and that the sharp corner is formed above the substrate but outside the channel region.

* * * * *